United States Patent [19]
Hornak et al.

[11] Patent Number: 5,345,189
[45] Date of Patent: Sep. 6, 1994

[54] VECTORIAL SIGNAL COMBINER FOR GENERATING AN AMPLITUDE MODULATED CARRIER BY ADDING TWO PHASE MODULATED CONSTANT ENVELOPE CARRIERS

[75] Inventors: Thomas Hornak, Portola Valley; William J. McFarland, Mountain View, both of Calif.

[73] Assignee: Hewlett-Packard Company, Palo Alto, Calif.

[21] Appl. No.: 124,123

[22] Filed: Sep. 20, 1993

[51] Int. Cl.$^5$ .......................... H03F 9/00; H03F 3/00; H03D 5/00; H03D 13/00
[52] U.S. Cl. .................. 330/207 A; 330/124 R; 330/165; 330/166; 330/167
[58] Field of Search ............... 330/207 A, 124 R, 165, 330/166, 167, 107; 329/345, 346

[56] References Cited

U.S. PATENT DOCUMENTS

| | | | |
|---|---|---|---|
| 2,646,472 | 7/1953 | Rockwell | 330/124 R |
| 3,854,100 | 12/1974 | Pouzadoux | 330/207 A |
| 4,418,320 | 11/1983 | Guyton | 330/345 |
| 4,439,742 | 3/1984 | Sondermeyer | 330/124 R |

*Primary Examiner*—William L. Sikes
*Assistant Examiner*—Fetsum Abraham

[57] ABSTRACT

A circuit for combining first and second signals having the same frequency. The signals have a relative phase shift, 2a(t). The circuit generates a signal that is proportional to the sum or difference of signals. The circuit appears to be a resistive load; however, the circuit can be constructed from purely reactive circuit elements, and hence, does not dissipate energy. In one embodiment, the circuit is constructed from a transformer and two LC circuits in which the capacitance is varied in response to a(t). The circuit may be used to construct a high efficiency RF amplification stage.

6 Claims, 2 Drawing Sheets

VECTORIAL SIGNAL COMBINER FOR GENERATING AN AMPLITUDE MODULATED CARRIER BY ADDING TWO PHASE MODULATED CONSTANT ENVELOPE CARRIERS

FIELD OF THE INVENTION

The present invention relates to RF power amplifiers, and more particularly, to a circuit for combining two phase modulated constant envelope carriers.

BACKGROUND OF THE INVENTION

Mobile wireless phone and data communication have become increasingly popular. These applications, however, pose two special problems. First, the available bandwidth for transmitting information is limited due to the general shortage of available spectrum. As a result, both the amplitude and the phase of the carrier must be modulated to reduce the required bandwidth. Amplifying the amplitude modulated carrier without excessive distortion in the transmitter output stage imposes significant linearity constraints on the output stage amplifier.

Second, the power efficiency of the mobile transmitter is very important because the mobile end of the wireless communication link is usually battery powered. Typically, the transmitter output stage is the largest power consumer; hence, improvement in this stage is the most important. One of the most efficient power amplifiers are the class C and E RF amplifiers in which the output transistor conducts current only at the time when the collector-emitter voltage is at its lowest value. Unfortunately, class C and E amplifiers are very nonlinear and introduce substantial distortion of the amplitude modulation. Because of this distortion, class C and E amplifiers are used mainly in FM transmitters in which the amplitude or "envelope" of the RF carrier is constant, and hence, such distortion has no effect.

One method for avoiding this distortion with class C amplifiers and still allowing linear amplitude modulation is to generate two signals with constant amplitude using the class C amplifiers and then combining these signals. The amplitude modulation is achieved by modulating the relative phase of the two constant amplitude signals. Denote the two signals by $V_1$ and $V_1$, respectively.

$$V_1 = V\sin[\omega t + mt(t) + a(t)] \quad (1)$$

and $$V_2 = V\sin[\omega t + mt(t) - a(t)] \quad (2)$$

Here, m(t) is the desired phase modulation of a carrier having angular frequency $\omega$, and a(t) and −a(t) are additional phase modulations of the two carriers. By adjusting a(t), the output of the sum signal can be varied from 0 to 2V. In particular, if an output voltage of $V_{out}$ is desired, $a(t) = \arccos(V_{out}/2V)$. Methods for generating the phase angle, a(t), are described, for example, by D. C. Cox in "Linear Amplification with Nonlinear Components", IEEE Transactions on Communications, December 1974, pp. 1942–1945.

While this method, in principle, solves the problem of using class C amplifiers to provide the desired amplitude modulation, there are two problems in constructing a vectorial signal combiner for use in such a system. First, to minimize the power losses in the vectorial signal combiner itself, the combiner must consist of nominally reactive components only. This reduces the power dissipated in the combiner itself.

Second, the combiner must present a load to the two constant envelope amplifiers with unity power factor at all levels of the modulated output. A load with unity power factor presents an impedance that has no imaginary part, i.e., the voltage and current at the load are in phase. This constraint maximizes the overall power efficiency when the load is driven by class C or E type power amplifiers. Consider the case in which the constant envelope carriers are supplied by class C npn transistor stages. At all phase angles a(t), when the transistor conducts current, the sinusoidal voltage on the collector must be at its negative peak to minimize power dissipation in the transistors. This occurs only when the class C amplifier drives a load with unity power factor.

No combiner satisfying both conditions is taught in the prior art. The closest combiner to the above goals is a combiner described by H. Chireix in "High Power Outphasing Modulation", Proceedings of the Institute of Radio Engineers, November 1935, pp. 1370–1392. This combiner has two flaws. First it relies on fixed elements which are not tuned as a(t) changes. Using fixed elements results in a combiner which has a power factor that only approximates unity, and rapidly falls to zero for a(t) > 72 degrees. This restricts the range of output amplitudes that can be supplied by the circuit, and sacrifices efficiency even within that range. Second, the combiner uses uncoupled inductors to connect to the load. There is always a voltage drop across these inductors, even when the two amplifiers are in phase (a(t)=0). Therefore, a larger voltage swing is required at the amplifiers to support a given maximum voltage swing at the load. It is undesirable to generate large voltage swings in battery powered equipment.

Broadly, it is the object of the present invention to provide an improved vectorial signal combiner.

It is a further object of the present invention to provide a vectorial signal combiner that uses only reactive components.

It is a still further object of the present invention to provide a vectorial signal combiner that presents a load to the two constant envelope amplifiers with a unity power factor at all levels of modulated output.

These and other objects of the present invention will become apparent to those skilled in the art from the following detailed description of the invention and the accompanying drawings.

SUMMARY OF THE INVENTION

The present invention is a circuit for combining first and second signals having the same frequency. The signals have a relative phase shift, 2a(t). The circuit generates a signal that is proportional to the sum or difference of signals. The circuit includes first and second inputs for receiving the first and second signals, respectively. The received signals are combined in a circuit element that generates a signal having an amplitude that is related to either the vectorial sum or difference of the signals. First and second reactive circuit elements are connected to the first and second inputs respectively. The impedance of these elements is varied in response to changes in a(t) such that the voltage on each of the first and second inputs is in phase with the current entering each of the first and second inputs, respectively. In one embodiment of the present invention, the first and second reactive circuit elements are constructed from an LC tank circuit in which the current through either the capacitor or inductor is changed in response to a(t).

DETAILED DESCRIPTION OF THE INVENTION

Figure 1:
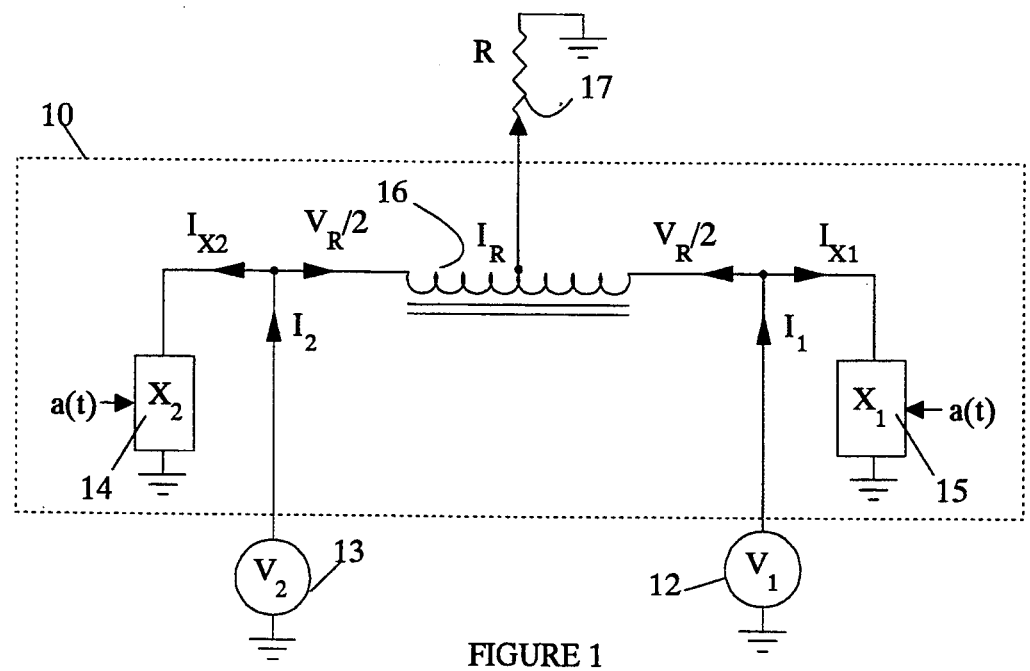
FIG. 1 is a schematic drawing of the preferred embodiment of a combiner according to the present invention.

A schematic diagram of a combiner according to the present invention for combining two signals $V_1(t)$ and $V_2(t)$ generated by sources 12 and 13 is shown in FIG. 1 at 10. The signals are combined in a transformer 16 having a single center tapped winding for applying the combined signal to the desired load 17 (the antenna). Two reactive loads 14 and 15 having impedances of $X_1$ and $X_2$, respectively, are used to adjust the current being drawn from sources 12 and 13. The current from sources 12 and 13 will be denoted by $I_1(t)$ and $I_2(t)$, respectively, in the following discussion. The current taken by the load will be denoted by $I_R(t)$, and the current through the reactive loads will be denoted by $I_{X1}(t)$ and $I_{X2}(t)$, respectively. The voltage across load R will be denoted by $V_R(t)$.

In the following discussion, it will be assumed that the bandwidth of phase modulations a(t) and m(t) is only a small fraction of the carrier frequency and that the phase modulation m(t) is applied to both $V_1(t)$ and $V_2(t)$ equally. Hence, m(t) can be neglected in the following discussion. That is, m(t) will be taken as equal to zero.

$V_1(t)$ and $V_2(t)$, can be expressed as two components, a common mode component that creates the same voltage on all three nodes of transformer 16 and acts across load 17, and a differential mode component that acts across transformer 16. The amplitude of the common mode component across R will be 2Vcos[a(t)], the magnitude of the differential mode component will be 2Vsin[a(t)]. The common mode component will generate a current $I_R(t)$ of amplitude 2(V/R)cos[a(t)] flowing in load 17. The differential mode will generate zero voltage across the load and no current into the transformer because of the transformer's idealized infinite impedance to differential signals. In the absence of the additional reactances $X_1$ and $X_2$, each of the two sources delivers half of the current through the load, i.e. a current of amplitude (V/R)cos[a(t)] and of common mode phase. Thus, the phase angle between the voltages $V_1(t)$, $V_2(t)$ and currents $I_1(t)$, $I_2(t)$ is a(t) and −a(t), respectively. In this case, the power/actor is cos[a(t)]. For a(t) approaching 90 degrees, the power factor approaches zero.

Now consider the case in which the reactances $X_1$ and $X_2$ are present. For a purely reactive impedance, $I_{X1}$ is 90 degrees out of phase with $V_1$. The contribution to $I_R$ from $V_1$ is $I_R/2$ and is out of phase with $V_1$ by a(t) degrees. If reactance $X_1$ is properly chosen, current $I_{X1}(t)$ will add to current $I_R(t)/2$ such that the total current $I_1(t)$ delivered by the source of $V_1(t)$ will be in phase with $V_1(t)$, thus ensuring a unity power factor. To maintain unity power factor for all values of a(t), current $I_{X1}(t)$, and thus reactance $X_1$ will have to be a function of a(t). It can be shown that reactance $X_1$ must be inductive and must depend on phase angle a(t) as:

$$X_1(a) = 4R/\sin[2a(t)] \quad (3)$$

$X_1$ is infinite for a(t)=0, inductive 4R for a(t)=45 degrees, and infinite again for a(t)=90 degrees.

Reactance $X_2$ follows a similar pattern.

$$X_2(a) = -4R/\sin[2a(t)] \quad (4)$$

$X_2$ will be infinite for a(t)=0, capacitive 4R for a(t)=45 degrees, and infinite again for a(t)=90 degrees.

Figure 2:
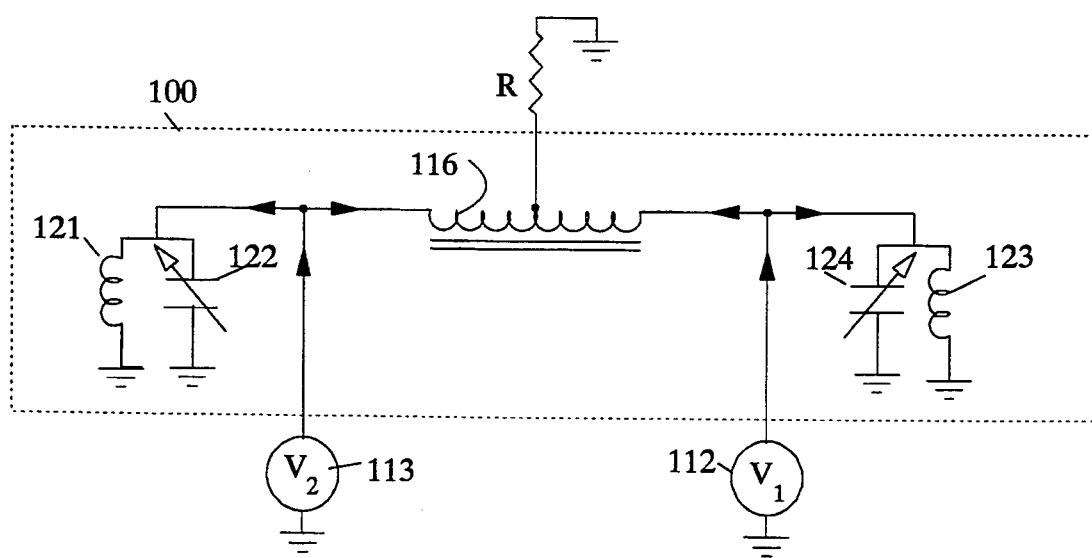
FIG. 2 is a more detailed schematic drawing of a combiner according to the present invention.

Refer now to FIG. 2 which is a more detailed schematic drawing of a combiner 100 according to the present invention. Combiner 100 combines the outputs of sources 112 and 113 utilizing transformer 116. The reactances used for reactances $X_1$ and $X_2$ shown in FIG. 1 are constructed from the parallel combination of a variable capacitor and a fixed inductor. While the reactances are shown as separate from voltage sources 112 and 113, it should be noted that these reactances could be part of the class C/E amplifiers in case such amplifiers are used as the voltage sources. In this case, the reactances would act both as the tank circuit for the amplifiers and as the power factor corrector for the combiner.

In combiner 100, $X_1$ consists of inductor 123 and capacitor 124. $X_2$ consists of inductor 121 and capacitor 122. The LC circuits may be tuned to have reactances from infinite to 4R inductive or capacitive. For the purposes of this discussion, it will be assumed that inductors 121 and 123 have the same inductances, L. Denote the capacitances of capacitors 122 and 124 by $C_2$ and $C_1$, respectively. Capacitors 122 and 124 may be tuned, for example by using varactor diodes. When the circuits are tuned to resonate with the carrier frequency, they represent an infinite reactance. When the capacitor is increased above the resonance value, the circuit becomes a capacitive reactance, when the capacitor is decreased below its resonant value the circuit becomes an inductive reactance.

The proper choice of $C_1$ and $C_2$ to satisfy Eqs. (3) and (4) is given by $$\frac{C_1}{C_0} = 1 + \frac{\sin[2a(t)]}{2Q} \quad (5)$$

and $$\frac{C_2}{C_0} = 1 - \frac{\sin[2a(t)]}{2Q} \quad (6)$$

where $Q = 2R/\omega L$, and $C_0$ is the value of $C_1$ and $C_2$ which resonates with L at the carrier frequency $\omega$.

While combiner 100 has been described in terms of tuning the capacitors, it will be apparent to those skilled in the art that the variable reactances $X_1$ and $X_2$ may be implemented by tuning inductors 121 and 123.

Figure 3:
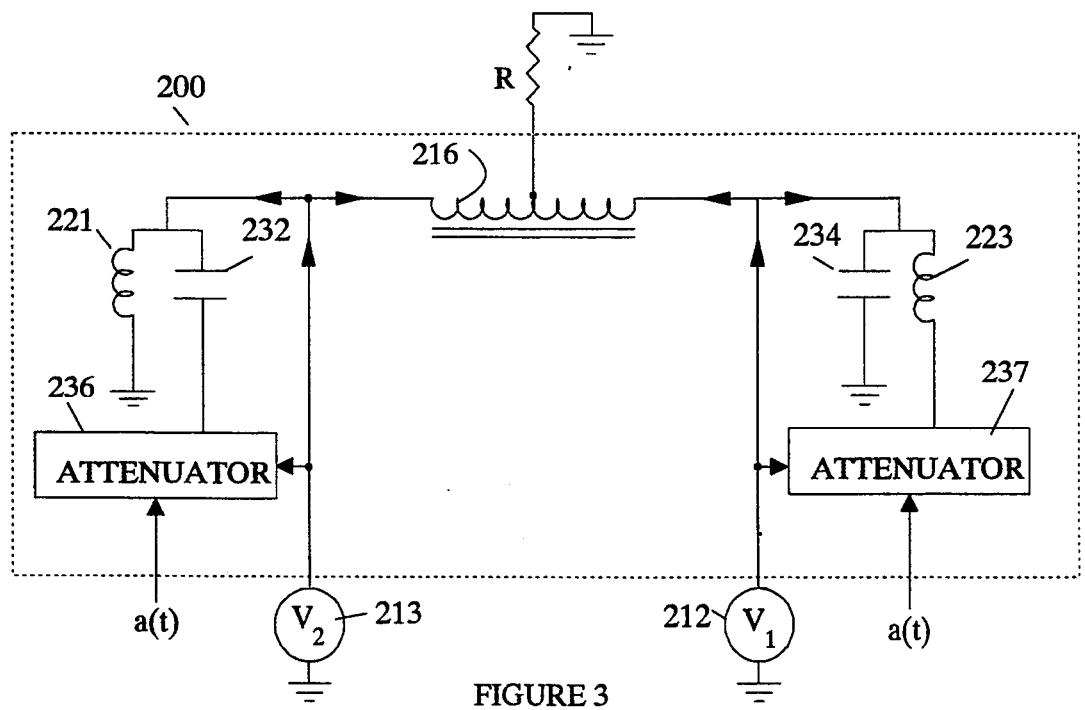
FIG. 3 is a schematic drawing of another embodiment of the present invention.

An alternate method is to change the balance of reactive currents through $L_1$ and $C_1$ and through $L_2$ and $C_2$ by applying across at least one of the two elements on each side a varying percentage of $V_1(t)$ and $V_2(t)$, respectively. An embodiment of the present invention utilizing this method of tuning the reactance currents is shown in FIG. 3 at 200. Combiner 200 vectorially adds the signals from generators 212 and 213 in transformer 216. Reactance $X_2$ is implemented as capacitor 232 and inductor 221. A fraction of the signal from generator 213 is applied by attenuator 236 to one side of capacitor 232. As a result, the potential across capacitor 232 is a fraction of the potential applied across capacitor 122 in the embodiment shown in FIG. 2. The fraction in question is controlled by a function of a(t). Since the current flowing through capacitor 232 is proportional to the potential difference across capacitor 232, the "effective capacitance" of capacitor 232 decreases as the fraction increases.

Reactance $X_1$ is likewise implemented as a fixed capacitor 234 and a fixed inductor 223. A fraction of the potential from signal generator 212 is applied to one side of inductor 223 with the aid of attenuator 237. The fraction in question is controlled by a function of a(t). Eqs. (5) and (6) may be used to derive the relationship between the fraction of the signals applied and a(t).

Figure 4:
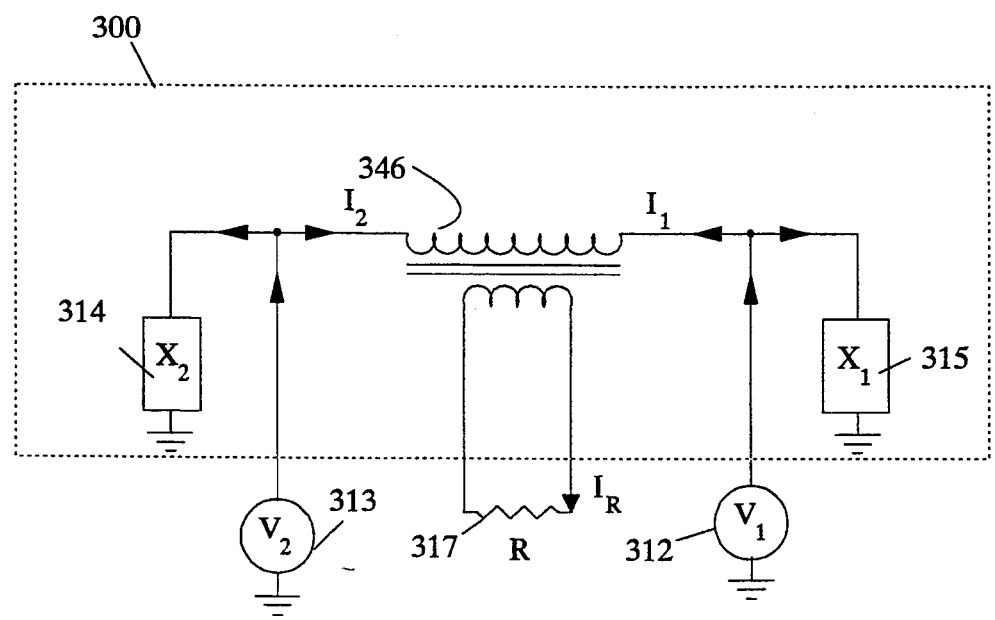
FIG. 4 is a schematic drawing of an alternative embodiment of the present invention in which the combiner generates a signal that is proportional to the vectorial difference of the input signals.

While the above embodiments of the present invention have operated by computing the vectorial sum of the two signal sources, it will be apparent to those skilled in the art that a combiner that operates by computing the vectorial difference of the two signals may also be constructed from the teachings of the present invention. Such a combiner is shown at 300 in FIG. 4. Combiner 300 generates a signal which is proportional to the vectorial difference of the currents generated by signal generators 312 and 313. Transformer 346 generates a current that is proportional to the difference between currents $I_1$ and $I_2$. This difference signal is provided across load 3 17 by a secondary winding in transformer 346. Reactances 314 and 3 15 are tuned in a manner similar to that described above.

It will be apparent from the proceeding discussion that the present invention solves the problems described above with respect to the prior art. Because reactive elements within the combiner are tuned as a(t) is changed, the power factor can always be exactly unity over all values of a(t). This allows 100% amplitude modulation of the signal at the load, with the highest possible efficiency at all times. The combiner of the present invention utilizes a transformer to couple the amplifiers to the load. When the amplifiers are in phase (a(t)=0), there is no voltage developed across the windings of the transformer. Therefore, the voltage swing at the amplifiers does not need to be larger than the voltage swing required at the load.

While the above embodiments of the present invention have utilized a transformer to perform the vector additions or subtractions, it will be apparent to those skilled in the art that other circuit elements may be utilized for this function. In the present invention, the adder comprises only reactive elements so that power is not dissipated in the adder. While a combiner according to the present invention utilizes reactive elements, it provides a load that is purely "resistive" to each of the signal generators. That is, the current and potential provided by each of the signal generators are in phase with one another independent of the phase shift a(t).

Various modifications to the present invention will become apparent to those skilled in the art from the foregoing description and accompanying drawings. Accordingly, the present invention is to be limited solely by the scope of the following claims.

What is claimed is:

1. A combiner for combining first and second signals having the same frequency but a time varying relative phase shift, to generate a signal proportional to the sum or difference of said first and second signals, said combiner comprising:

first and second inputs for receiving said first and second signals, respectively;

means for receiving a phase shift signal indicative of the value of said variable relative phase shift;

combining means, connected to said first and second inputs, for generating a signal related to the vectorial sum or difference of said first and second signals;

first and second reactive circuit elements, responsive to said phase shift signal, the reactance of each of said circuit elements being a function of said relative phase shift, said first reactive circuit element being connected to said first input and said second reactive circuit element being connected to said second input, wherein, for each value of said relative phase shift, the impedances of said first and second reactive circuit elements cause the current entering each of said first and second inputs to be in phase with the potential on each of said first and second inputs, respectively.

2. The combiner of claim 1 wherein said combining means comprises a transformer having a center tap.

3. The combiner of claim 1 wherein said first and second reactive circuit elements each comprise a parallel combination of an inductor and a capacitor, the current through either said inductor or said capacitor or both being varied in response to said phase shift signal.

4. The combiner of claim 3 wherein said current is varied by changing the impedance of one of said inductor or capacitor or both.

5. The combiner of claim 3 wherein said current is varied by changing the potential across one of said inductor or capacitor or both.

6. The combiner of claim 1 wherein said first and second signals are generated by a class C or E amplifier and wherein said first and second reactive circuit elements comprise the tank circuits in said class C or E amplifiers.

* * * * *